(12) United States Patent
Holt et al.

(10) Patent No.: US 11,195,925 B2
(45) Date of Patent: Dec. 7, 2021

(54) HETEROJUNCTION BIPOLAR TRANSISTORS

(71) Applicant: GLOBALFOUNDRIES U.S. INC., Santa Clara, CA (US)

(72) Inventors: Judson R. Holt, Ballston Lake, NY (US); Vibhor Jain, Williston, VT (US); Qizhi Liu, Lexington, MA (US); Ramsey Hazbun, Colchester, VT (US); Pernell Dongmo, Essex Junction, VT (US); John J. Pekarik, Underhill, VT (US); Cameron E. Luce, Colchester, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/732,755

(22) Filed: Jan. 2, 2020

(65) Prior Publication Data

US 2021/0091195 A1 Mar. 25, 2021

Related U.S. Application Data

(60) Provisional application No. 62/904,255, filed on Sep. 23, 2019.

(51) Int. Cl.
| | |
|---|---|
| *H01L 29/423* | (2006.01) |
| *H01L 29/66* | (2006.01) |
| *H01L 29/08* | (2006.01) |
| *H01L 29/737* | (2006.01) |

(52) U.S. Cl.
CPC .... *H01L 29/42304* (2013.01); *H01L 29/0817* (2013.01); *H01L 29/0821* (2013.01); *H01L 29/66242* (2013.01); *H01L 29/737* (2013.01)

(58) Field of Classification Search
CPC ......... H01L 29/42304; H01L 29/66242; H01L 29/0817; H01L 29/0821; H01L 29/737
See application file for complete search history.

(56) References Cited

U.S. PATENT DOCUMENTS

| | | | |
|---|---|---|---|
| 5,494,836 A | * 2/1996 | Imai | ................... H01L 29/7378 438/312 |
| 7,598,539 B2 | 10/2009 | Wilhelm | |
| 8,536,012 B2 | 9/2013 | Camillo-Castillo et al. | |
| 8,933,537 B2 | 1/2015 | Fox et al. | |

OTHER PUBLICATIONS

Rücker et al., "High-performance SiGe HBTs for next generation BiCMOS technology", IOP Publishing Ltd., Oct. 10, 2018, 7 pages.

* cited by examiner

*Primary Examiner* — Syed I Gheyas
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to heterojunction bipolar transistors and methods of manufacture. The structure includes: a sub-collector region in a substrate; a collector region above the sub-collector region, the collector region composed of semiconductor material; an intrinsic base region composed of intrinsic base material surrounded by the semiconductor material above the collector region; and an emitter region above the intrinsic base region.

15 Claims, 8 Drawing Sheets

HETEROJUNCTION BIPOLAR TRANSISTORS

FIELD OF THE INVENTION

The present disclosure relates to semiconductor structures and, more particularly, to heterojunction bipolar transistors and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications due to good RF performance, high breakdown voltage and integration with CMOS.

It is known that high performance HBT devices require extremely sharp dopant profiles, low resistances and low parasitic capacitances. For example, high Ccb (i.e., the collector-base capacitance) limits the fT and fmax of the HBT. Also, performance is limited by: High Rb (fmax); High CBE, CCB (fT/fmax); and SiGe base dopant profile broadening (fT). These parameters are currently limited by thermal budgets of downstream processes associated with BiCMOS processes, amongst other issues. Carbon doping in the SiGe base is used to help limit dopant diffusion, but still cannot achieve the narrowest dopant profile. Scaling can help reduce the total capacitance, but increases parasitic resistances.

SUMMARY

In an aspect of the disclosure, a structure comprises: a sub-collector region in a substrate; a collector region above the sub-collector region, the collector region composed of semiconductor material; an intrinsic base region composed of intrinsic base material surrounded by the semiconductor material above the collector region; and an emitter region above the intrinsic base region.

In an aspect of the disclosure, a structure comprising: a sub-collector region; a single crystalline material above the sub-collector region; a doped material which is above or partially penetrates into the single crystalline material; a recess that extends at least into the doped material; an intrinsic base formed within the recess; spacers formed on the doped material and which define an emitter region; an extrinsic base composed of the doped material along outer edges of the spacers and which connects to the intrinsic base within the recess; and emitter material above the extrinsic base and between the spacers.

In an aspect of the disclosure, a method comprises: forming a sub-collector region in a substrate; forming a collector region above the sub-collector region; forming a recess in the collector region; forming an intrinsic base region in the recess formed in the collector region; and forming an emitter region above the intrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
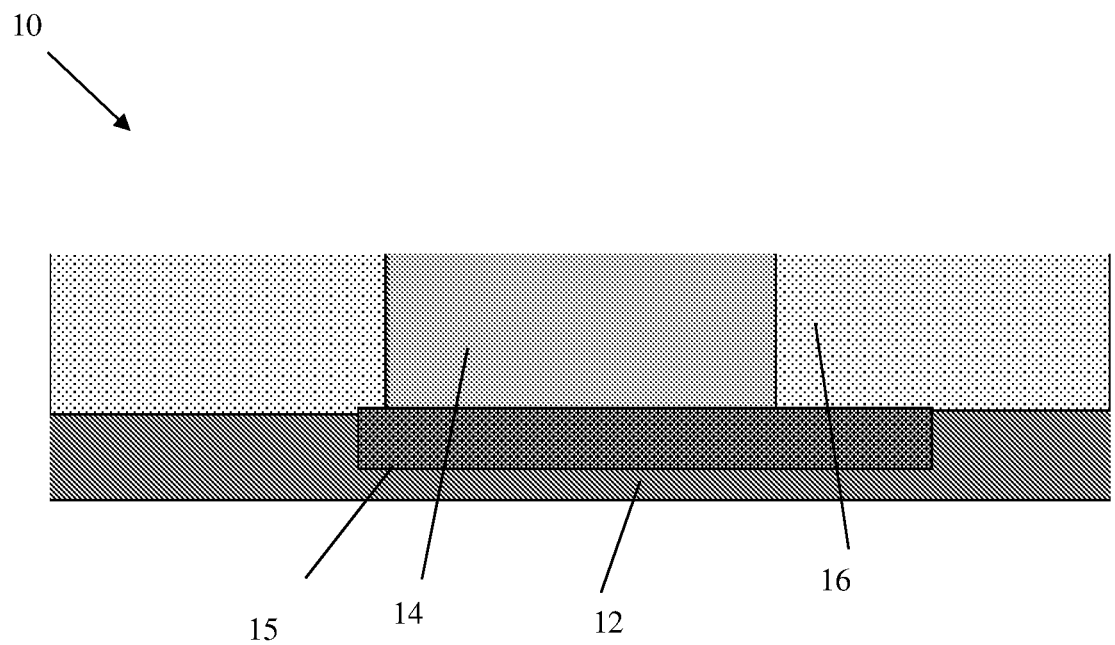
FIG. 1 shows a sub-collector region, amongst other features, and respective fabrication processes in accordance with aspects of the present disclosure.

The present disclosure relates to semiconductor structures and, more particularly, to heterojunction bipolar transistors and methods of manufacture. More specifically, the present disclosure relates to heterojunction bipolar transistors with recessed semiconductor material with a selective epitaxial base, e.g., selective epitaxial SiGe base. Advantageously, the present disclosure provides a high performance heterojunction bipolar transistor device with low resistance, low capacitance and a sharper dopant profile (compared to known devices).

In embodiments, the high performance heterojunction bipolar transistor devices described herein include a SiGe base layer formed by a Si recess and selective epitaxy regrowth. In embodiments, the recess depth can be varied depending on the required performance characteristics of the heterojunction bipolar transistor device. For example, different recess depths are contemplated to change device performance (fT vs. Bvceo/Bvcbo). An alternate embodiment includes a highly doped contact region formed during non-selective epitaxy processing. Benefits that are achieved by implementing the processes described herein and resulting devices include, amongst other advantages: sharper SiGe base dopant profile (boron or other p-type dopants), prior to final rapid thermal anneal processes; reduced or eliminated CBEox (emitter-base capacitance component associated with oxide spacer)/CBCox (collector-base capacitance associated with STI); improved RB link (extrinsic base to intrinsic base link resistance), e.g., closer proximity and higher dopant; and improved spacer scaling and and/or thinner epitaxial material growth.

In more specific embodiments, the high performance heterojunction bipolar transistor devices include a lateral intrinsic base and extrinsic base connection. A SiGe intrinsic base is formed by selective epitaxy in a cavity surrounded by single crystal silicon. Spacers are formed around the emitter, with the emitter being composed of, e.g., silicon, in a "cavity" or space between the spacers. The extrinsic base is formed along the outer edge of the spacers and is thinner than the height of spacers. An emitter contact touches the spacer within the cavity. In embodiments, the SiGe base can be discontinuous below the spacers at a connection for the intrinsic base and extrinsic base. In embodiments, a dopant profile is provided at the edge of the recess, e.g., Si recess.

The high performance heterojunction bipolar transistor devices of the present disclosure can be manufactured in a number of ways using a number of different tools. In general, though, the methodologies and tools are used to form structures with dimensions in the micrometer and nanometer scale. The methodologies, i.e., technologies, employed to manufacture the high performance heterojunction bipolar transistor devices of the present disclosure have been adopted from integrated circuit (IC) technology. For example, the structures are built on wafers and are realized in films of material patterned by photolithographic processes on the top of a wafer. In particular, the fabrication of the high performance heterojunction bipolar transistor devices use three basic building blocks: (i) deposition of thin films of material on a substrate, (ii) applying a patterned mask on top of the films by photolithographic imaging, and (iii) etching the films selectively to the mask.

FIG. 1 shows a sub-collector region, amongst other features, and respective fabrication processes in accordance with aspects of the present disclosure. More specifically, the structure 10 of FIG. 1 includes a lightly doped p-type substrate 12 composed of semiconductor material and, preferably, bulk Si material. In any of the embodiments, the substrate 12 may be composed of any suitable material including, but not limited to, Si (e.g., single crystalline Si), SiGe, SiGeC, SiC, GaAs, InAs, InP, and other III/V or II/VI compound semiconductors. In further embodiments, the substrate 12 may be silicon on insulator technology (SOI) which includes an insulator layer on top of the semiconductor layer and another semiconductor layer (e.g., single crystalline Si), on top of the insulator layer. The insulator is formed by any suitable process such as separation by implantation of oxygen (SIMOX), oxidation, deposition, and/or other suitable process. The other semiconductor layer on top of the insulator layer can be fabricated using wafer bonding, and/or other suitable methods.

Still referring to FIG. 1, a sub-collector region 15 is formed within the substrate 12 by a doping process, e.g., ion implantation. The sub-collector region 15 can be a highly doped n-type region, i.e., phosphorus or arsenic, formed by ion implantation processes or other known diffusion processes such that no further explanation is required herein. A collector region 14 is also provided in the substrate 12. The collector region 14 can be undoped or a n-type dopant, similar to the sub-collector region 15. Also, in embodiments, the collector region 14 can be Si material, and preferably a single crystalline Si material; although other semiconductor materials are contemplated herein.

FIG. 1 further shows shallow trench isolation regions 16 formed within the substrate 12, isolating the collector region 14 (and over the sub-collector region 15). The shallow trench isolation regions 16 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. The resist can then be removed by a conventional oxygen ashing process or other known stripants. Following the resist removal, insulator material (e.g., oxide material) can be deposited by any conventional deposition processes, e.g., chemical vapor deposition (CVD) processes. Any residual insulator material on the surface of the substrate 12 can be removed by conventional chemical mechanical polishing (CMP) processes.

Figure 2:
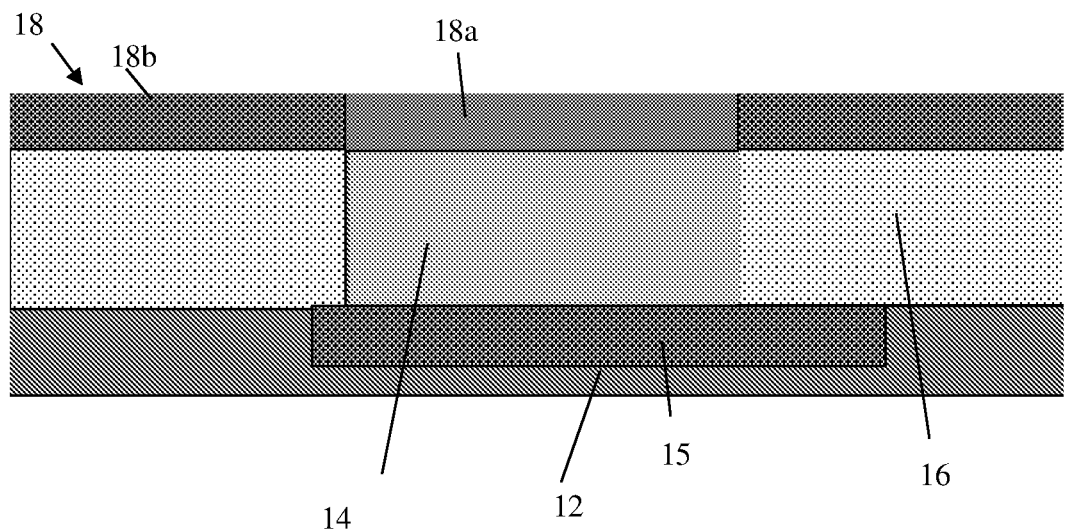
FIG. 2 shows an epitaxial material on a surface of a substrate, amongst other features, and respective fabrication processes in accordance with aspects of the present disclosure.

In FIG. 2, an epitaxial material 18 is grown on the surfaces of the substrate 12. More specifically, an epitaxial material 18 is grown over the shallow trench isolation regions 16 and the collector region 14. In embodiments, the epitaxial material 18 is an undoped semiconductor material that is deposited by a non-selective growth process, which grows directly on the shallow trench isolation regions 16 and the collector region 14. The undoped semiconductor material is preferably Si; although other semiconductor materials are also contemplated herein.

As should be understood by those of skill in the art, the undoped semiconductor material will grow as a single crystalline Si material 18a over the collector region 14 (which is also single crystalline material) and an amorphous or polysilicon material 18b over the shallow trench isolation regions 16. The epitaxial material 18 can have a thickness of about 5 nm to about 100 nm, as an illustrative example. In an optional embodiment, the epitaxial material 18 can be planarized by a conventional chemical mechanical polishing (CMP) process. Although the boundary between the materials 18a and 18b is shown to be vertical, it can have alternate angles (i.e., less than or greater than 90 degrees) depending on the growth conditions, for example.

Figure 3:
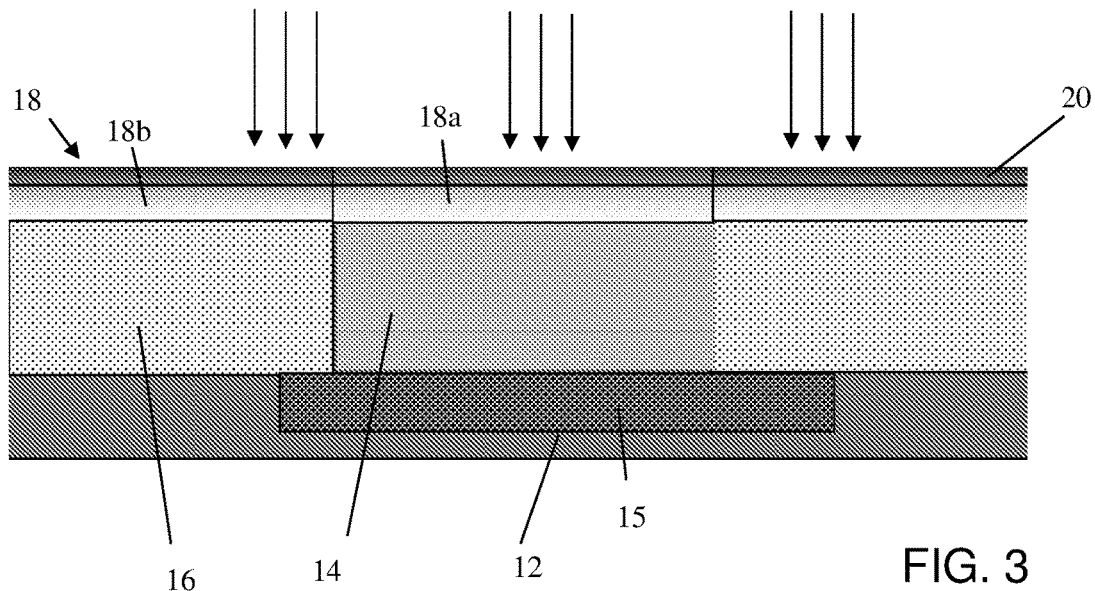
FIG. 3 shows a low resistance layer on the epitaxial material, amongst other features, and respective fabrication processes in accordance with aspects of the present disclosure.

In FIG. 3, the epitaxial material 18 is subjected to an implant process to form a low resistance layer 20 used as an extrinsic base contact. More specifically, the epitaxial material 18 is subjected to a P+ type implant process to form the low resistance layer 20 for a NPN bipolar transistor. In embodiments, the P+ type implant can be boron or $BF_2$, for example. The implant process is provided at a high dose and low energy, e.g., between 0.5-10 keV energy and between 1e13-1e16 cm-2 dose, which will partially penetrate into the epitaxial material 18 to a depth of about 2 nm to about 20 nm as an illustrative example. In this way, the implant, e.g., low resistance layer 20, will not completely consume or penetrate through the entirety of the epitaxial material 18 used to form the collector region. In addition to B or $BF_2$ implant, other implant species including Ge and/or C can be implanted at the same time to reduce B out-diffusion from subsequent thermal processes.

In an alternative embodiment, the low resistance layer 20 can be a doped epitaxial material grown directly on the undoped epitaxial material 18. In embodiments, the doped epitaxial material, i.e., the low resistance layer 20, and the undoped epitaxial material 18 can be grown in a same epitaxy tool. For example, the doped epitaxial material can preferably be SiGe material grown directly on the undoped epitaxial material 18 in the same epitaxy tool. The doped SiGe material is a P+ doped SiGe material, which forms the low resistance layer 20. In still yet another alternative embodiment, the doped epitaxial material (e.g., low resistance layer 20) can be grown directly on undoped epitaxial material 18 after the formation of the collector region, base region and the emitter region.

Figure 4:
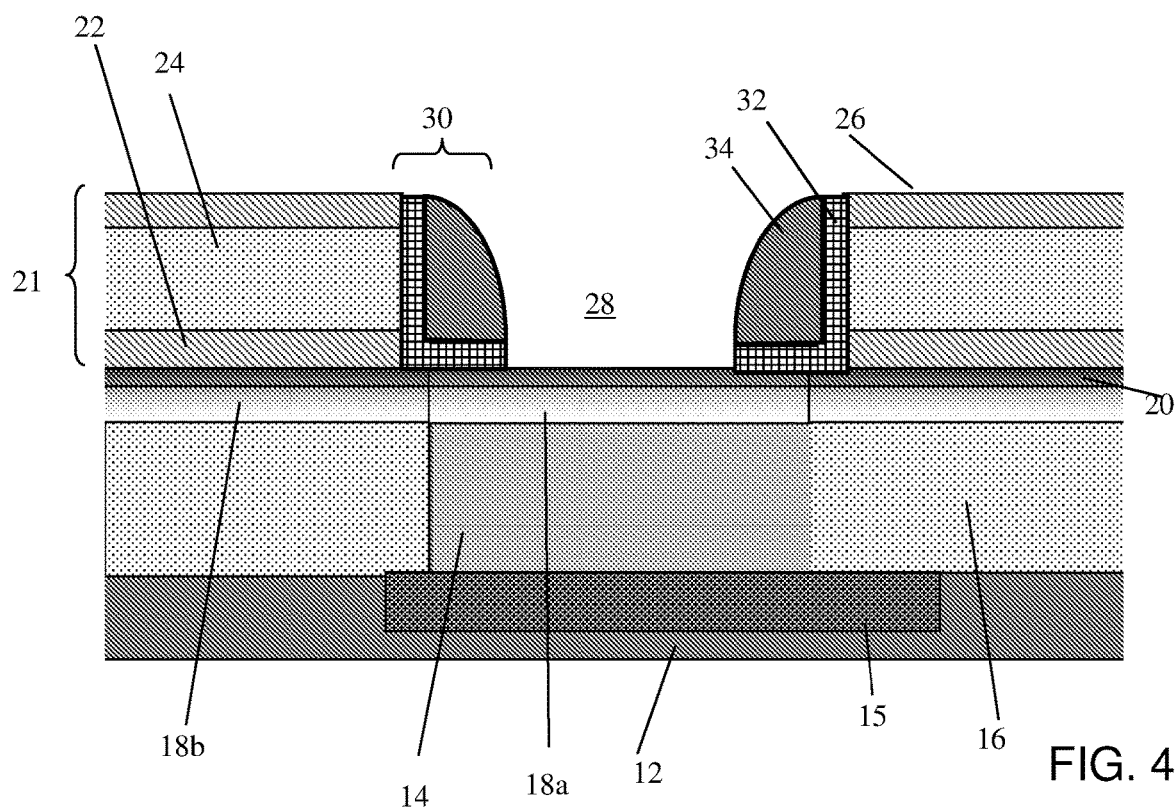
FIG. 4 shows spacers over the low resistance layer, amongst other features, and respective fabrication processes in accordance with aspects of the present disclosure.

FIG. 4 shows spacers 30 over the low resistance layer 20, amongst other features, and respective fabrication processes in accordance with aspects of the present disclosure. More specifically, a stack of materials 21 is deposited on the low resistance layer 20. The stack of materials 21 include, e.g., an oxide material 22, nitride material 24 and an oxide material 26, sequentially deposited using conventional deposition processes. For example, the stack of materials 22, 24, 26 can be deposited sequentially using chemical vapor deposition (CVD) processes. An opening 28 is formed in the stack of materials 21 using conventional lithography and etching processes as already described herein such that no further explanation is required for a complete understanding of the present disclosure. In embodiments, the opening 28 is aligned with the collector region 14 and exposes a portion of the low resistance layer 20, over the undoped epitaxial material 18. In embodiments, the opening will align with a collector region 14.

Still referring to FIG. 4, sidewall spacers 30 are formed on the sidewalls of the opening 28. The sidewall spacers 30 are composed of oxide material 32 and nitride material 34. In embodiments, the oxide material 32 and nitride material 34 are blanket deposited, e.g., using CVD processes, over the oxide material 26 and within the opening 28. Following the deposition process, the materials 32, 34 are subjected to an anisotropic etching process to form the sidewall spacers 30. In this way, the opening 28 will be fully aligned with the collector region 14.

Figure 5:
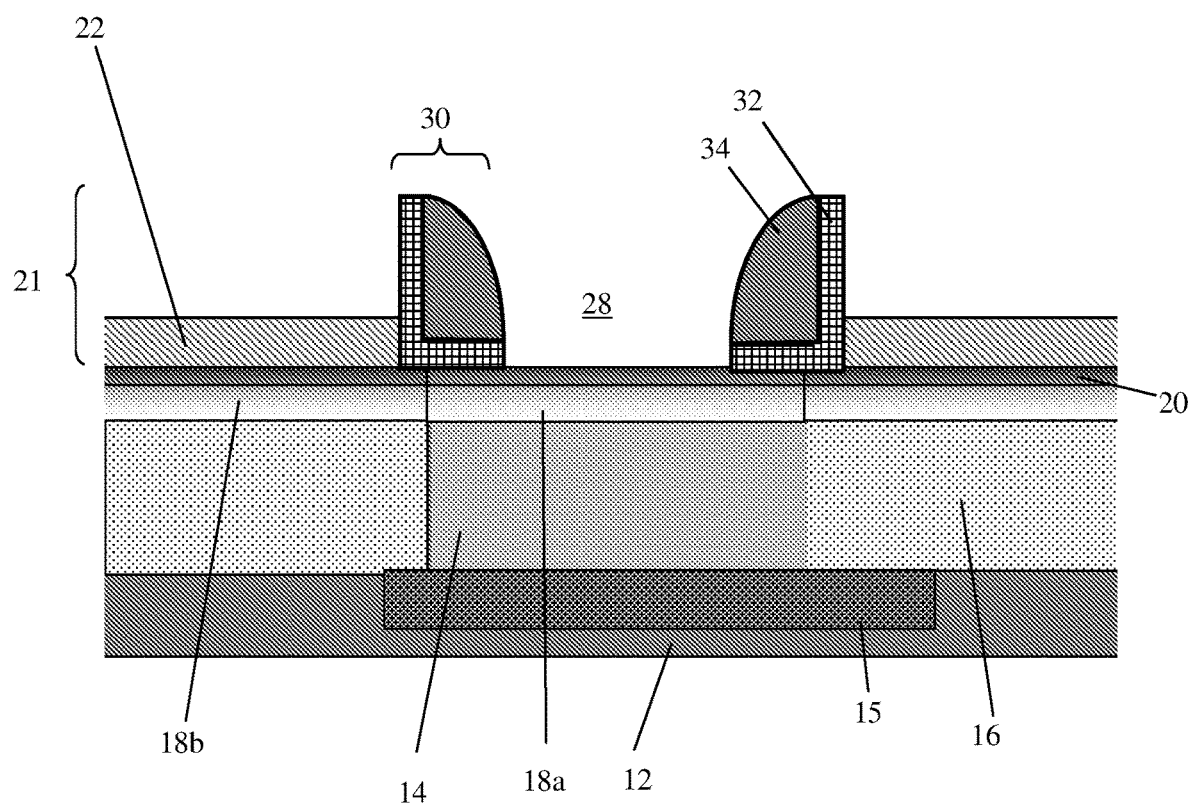
FIG. 5 shows removal of materials of a stack of materials, amongst other features, and respective fabrication processes in accordance with aspects of the present disclosure.

FIG. 5 shows removal of the materials 24, 26 of the stack of materials by conventional etching processes, with chemistries selective to the materials 24, 26. In embodiments, the etching process can be performed by masking the sidewall spacers 30 and portions of the low resistance layer 20. That is, during this etching process, the sidewall spacers 30 and exposed portion of low resistance layer 20 over the collector region 14 will be protected by a hardmask material. The etching process will stop on the material 22. The masking material can be removed by conventional stripants such that no further explanation is required herein for an understanding of the present disclosure. A hot phosphorous touchup process can also be performed after the etching process.

Figure 6:
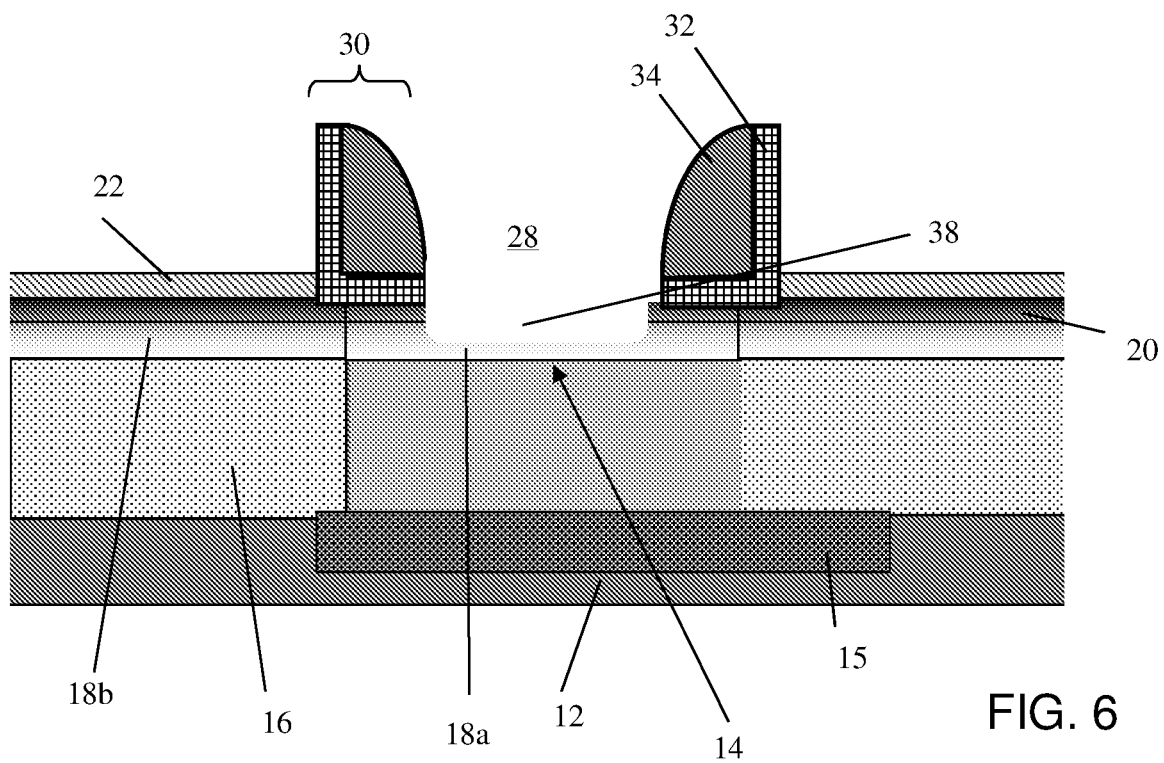
FIG. 6 shows a recess (e.g., Si cavity) between the spacers, amongst other features, and respective fabrication processes in accordance with aspects of the present disclosure.

In FIG. 6, a recess 38 is formed between the spacers 30, amongst other features, and respective fabrication processes. In particular, after removal of the masking materials, a recess 38 can formed through the low resistance layer 20 and partially into the undoped epitaxial material 18a, between the spacers 30. In alternate embodiments, the recess 38 can formed into the low resistance layer 20 and stopping on the undoped epitaxial material 18a. In yet further embodiments, when the low resistance layer 20 is a separate doped epitaxial material grown directly on the undoped epitaxial material 18, the recess 38 can be formed only in this material or through the material into the epitaxial material 18a. Accordingly, in embodiments, the recess 38 is a cavity in the Si epitaxial material 18a, which can have a particular depth depending on device performance requirements, e.g., fT vs. Bvceo/Bvcbo. The depth of the recess 38 can be, e.g., between 1 nm and 500 nm.

In embodiments, the recess 38 can be formed by conventional etching processes, i.e., RIE, with selective chemistries as should be understood by those of skill in the art. An optional oxidation and anneal can be performed to repair any damage from the etching process, e.g., RIE. For example, in optional embodiments, an oxidation and annealing process can be performed after the RIE to repair any RIE damage to the epitaxial material 18a.

Figure 7:
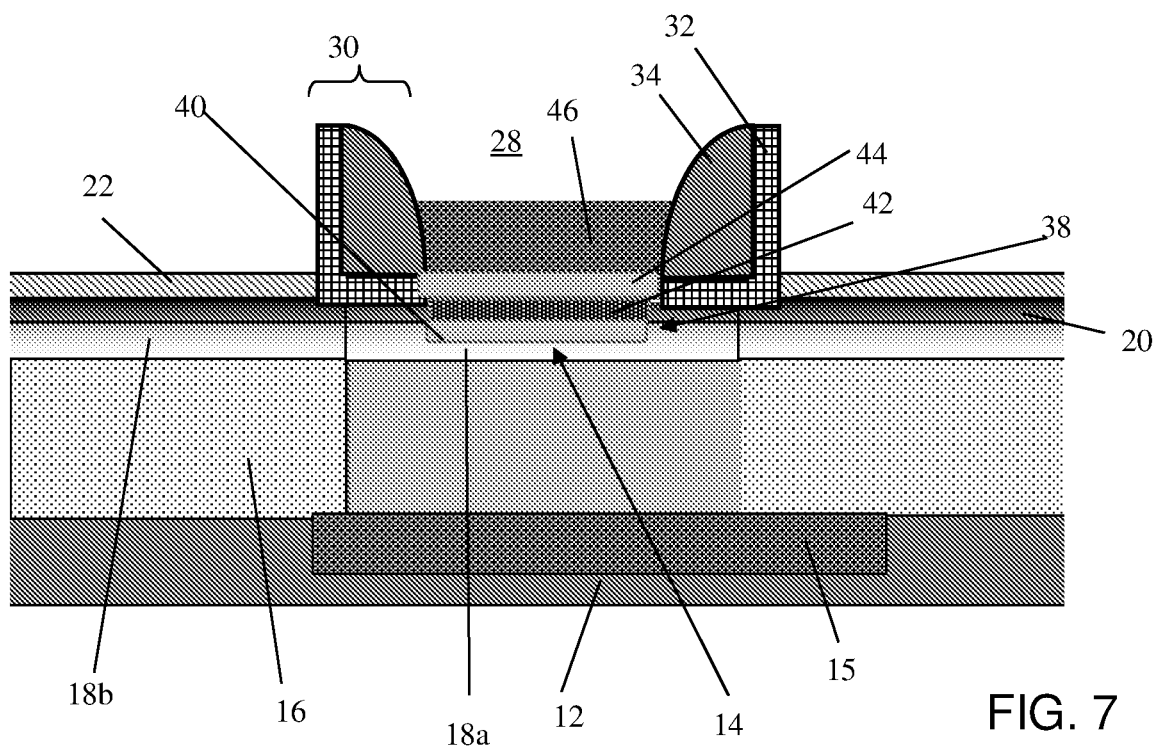
FIG. 7 shows a collector region, a base region and an emitter region, amongst other features, and respective fabrication processes in accordance with aspects of the present disclosure.

FIG. 7 shows a base region 42 and emitter region 46 between the spacers 30, amongst other features, and respective fabrication processes in accordance with aspects of the present disclosure. More specifically, in FIG. 7, an epitaxial material 40 is selectively grown on the material 18a and within the recess 38. In more specific embodiments, the epitaxial material 40 is a layer of undoped single crystalline Si material (over the collector region 14). A doped epitaxial material 42 is selectively grown on the epitaxial material 40. In embodiments, the doped epitaxial material 42 is composed of P+ doped, e.g., boron doped, SiGe material which is formed in the recess 38, e.g., surrounded by the single crystal Si material 18a. In this way, the doped SiGe epitaxial material 42 will form a discontinuous lateral intrinsic base of the device with a sharp change in dopant profile at its edges. The SiGe base material can also have carbon in the epitaxial layer to reduce B out-diffusion during subsequent annealing processes. The low resistance layer 20, i.e., Si material, can connect to the doped SiGe epitaxial material 42, and will act as an extrinsic base for the intrinsic base, e.g., epitaxial material 42, along the outer edge of the spacers 30.

In embodiments, the low resistance layer 20 is thinner than the height of spacers 30. In further embodiments, the SiGe base, e.g., doped epitaxial material 42, can be discontinuous below the spacers 30 at a connection for the intrinsic and extrinsic base.

FIG. 7 further shows an undoped epitaxial material 44 selectively grown on the doped epitaxial material 42. In embodiments, the material 44 is an undoped intrinsic layer separating the base region 42 from an emitter material 46. The undoped epitaxial material 44 can be any semiconductor material based material, e.g., Si or SiGe. The emitter material 46 is selectively grown on the undoped epitaxial material 44. In embodiments, the emitter material 46 is N-doped selective epitaxy semiconductor material, e.g., which can be doped with P or As. The emitter material 46 can also be formed by a deposition of N-type doped semiconductor material or provided by either an ion implantation process or diffusion process known to those of skill in the art such that no further explanation is required for a complete understanding of the present disclosure. It should also be recognized by those of skill in the art that the materials 40, 42, 44, 46 will not grow on the insulator material, e.g., oxide material 22, hence being a selective growth process.

Figure 8:
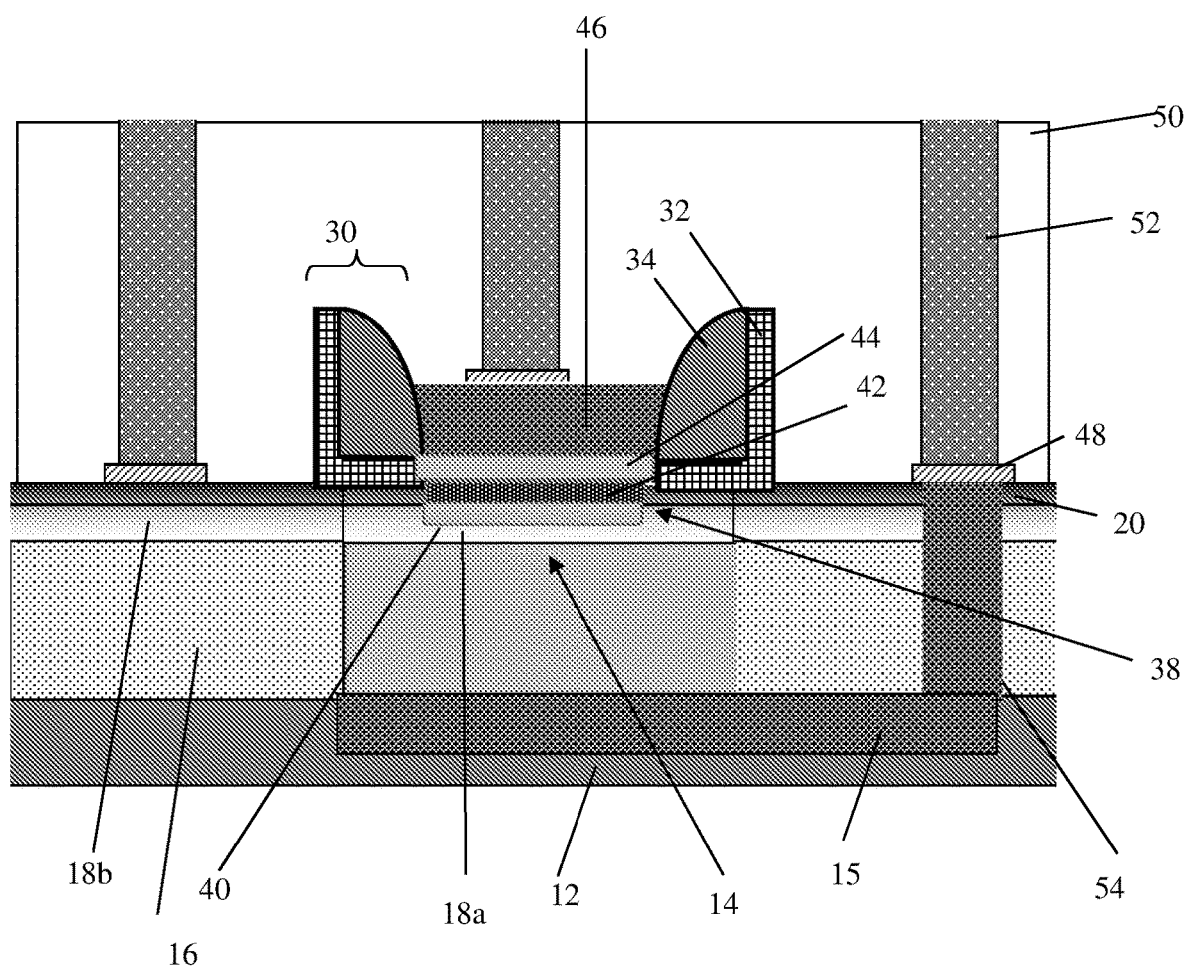
FIG. 8 shows contacts, amongst other features, and respective fabrication processes in accordance with aspects of the present disclosure.

In FIG. 8, the oxide material 22 is removed by conventional selective etching chemistries to expose the low resistance layer 20. Prior to contact formation, silicide contacts 48 are formed in contact with the collector region 14, e.g., sub-collector region 15, emitter region 46 and the extrinsic base (e.g., resistance layer 20). As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contacts 32. Following the reaction, any remaining transition metal is removed by chemical etching, leaving silicide contacts 32.

A dielectric material 50 is deposited over the structure, e.g., sub-collector region 15, emitter region 46 and the extrinsic base region (e.g., low resistance layer 20), followed by a lithography, etching and deposition processes (e.g., metallization process). For example, the dielectric material 50 is deposited by a CVD process, followed by the lithography and etching (e.g., RIE) processes to form trenches within the dielectric material 50. A metal material, e.g., aluminum or tungsten, is deposited within the trenches to form the contacts 52, e.g., collector contact, emitter region contact and extrinsic base contact. In embodiments, the contact to the sub-collector region 15 will be formed on a diffusion region (shown representatively as reference numeral 54) which will extend through the substrate 12, preferably through the shallow trench isolation regions 16 to the sub-collector region 15. In embodiments, the contact to the sub-collector region 15 can be formed with an additional Si contact to the either side of the device, as is well known to those of ordinary skill in the art such that no further explanation is required herein for a complete understanding of the present disclosure.

Figure 9:
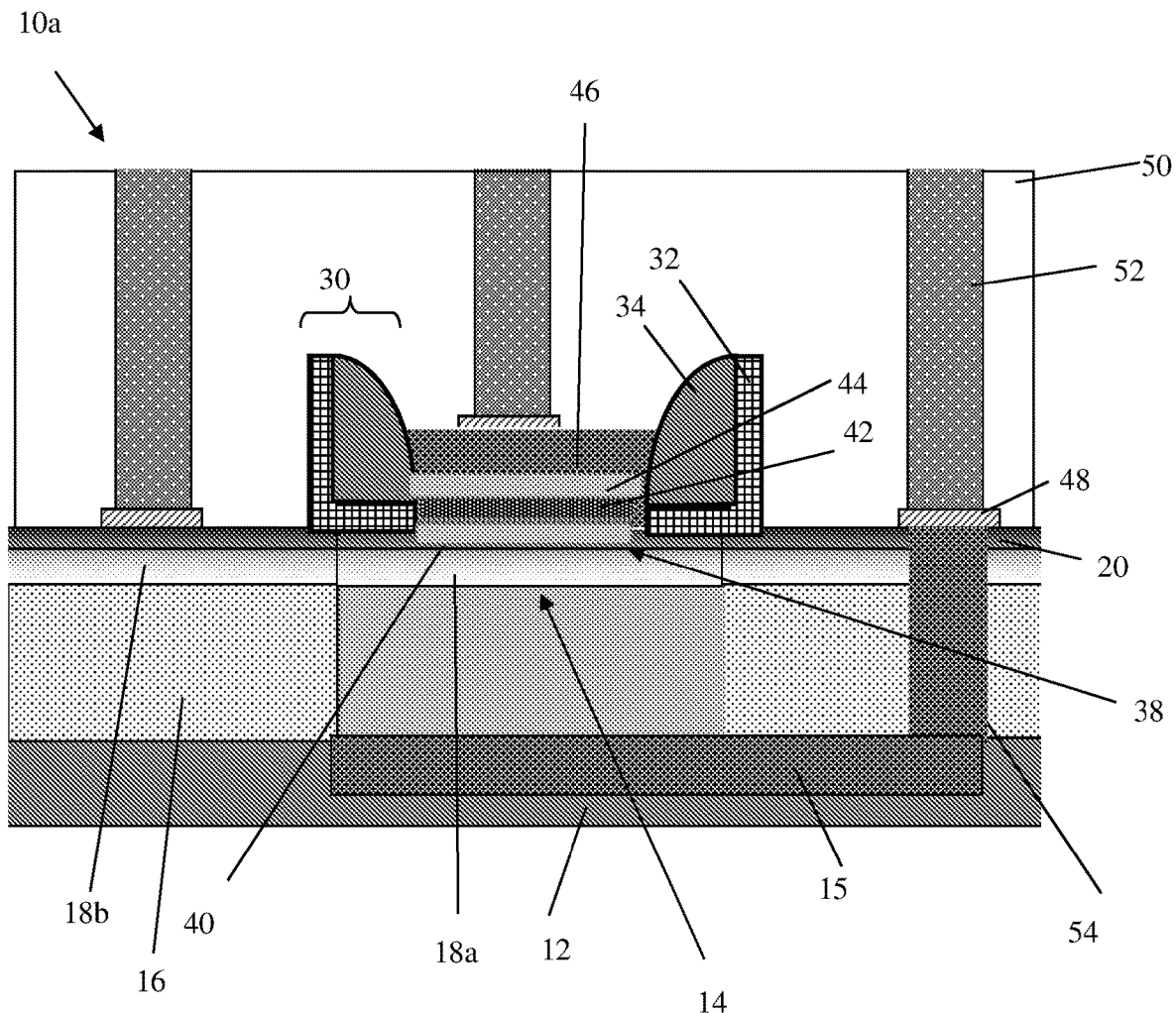
FIG. 9 shows a heterojunction bipolar transistor with a different depth profile in accordance with aspects of the present disclosure.

FIG. 9 shows a heterojunction bipolar transistor 10a with a different depth profile in accordance with aspects of the present disclosure. In this embodiment, the depth of the recess 38 will extend through the low resistance layer 20, exposing the single crystalline Si material 18a over the collector region 14. As noted already, the low resistance layer 20 can be a separate doped layer of material or can be the epitaxial material 18 subjected to an ion implantation process. In either scenario, the epitaxial material 40 is selectively grown within the recess 38, on the single crystalline Si material 18a over the collector region 14. Similarly, as described with respect to FIG. 7, a doped epitaxial material 42 is selectively grown on the epitaxial material 40, followed by epitaxial material 44. The contacts are then formed in the manner as described with respect to FIG. 8.

Figure 10A:
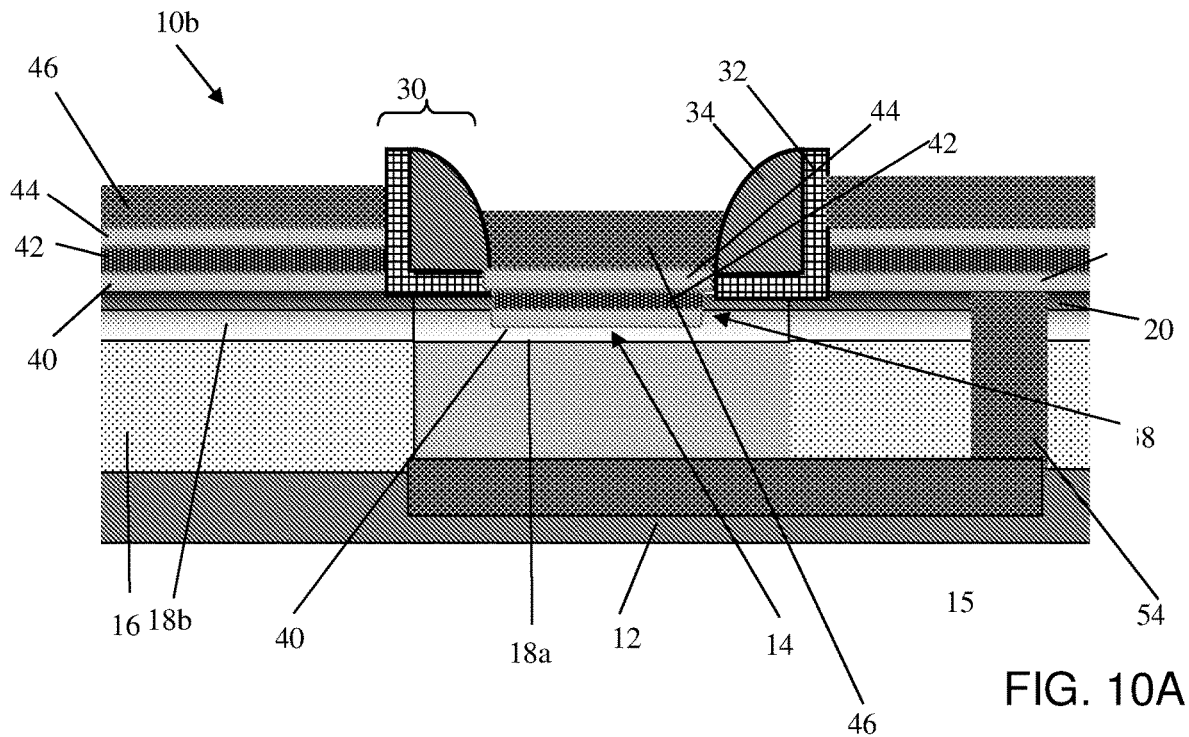
FIGS. 10A-10C show a heterojunction bipolar transistor and respective fabrication processes in accordance with additional aspects of the present disclosure.
Figure 10B:
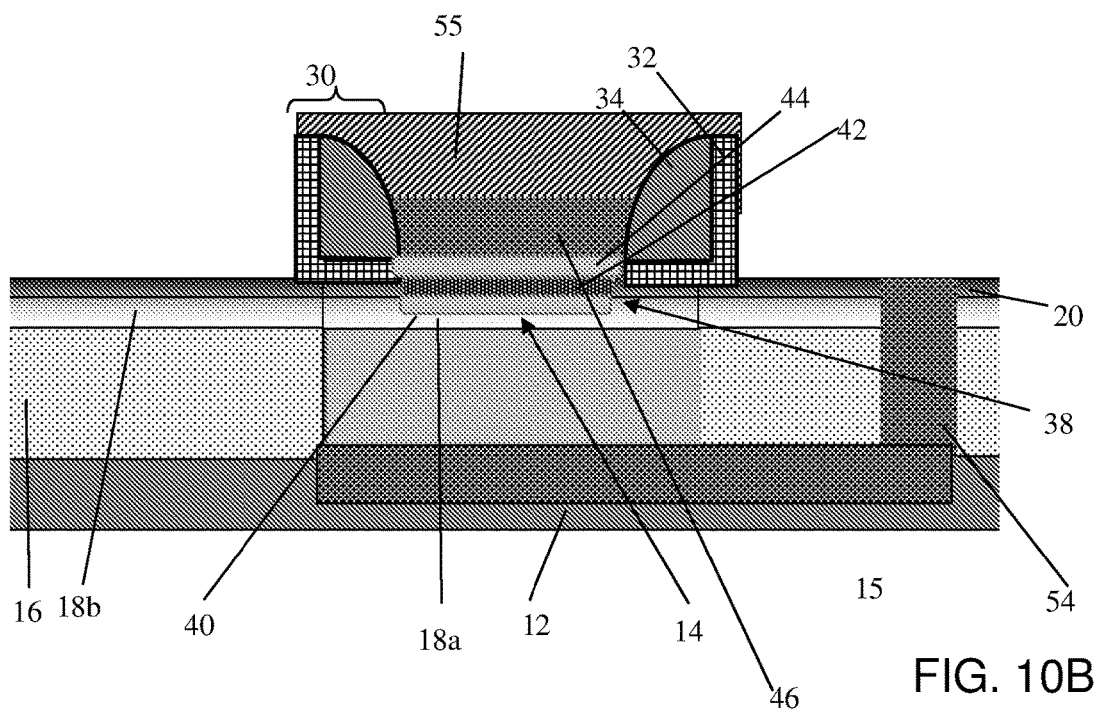
Figure 10C:
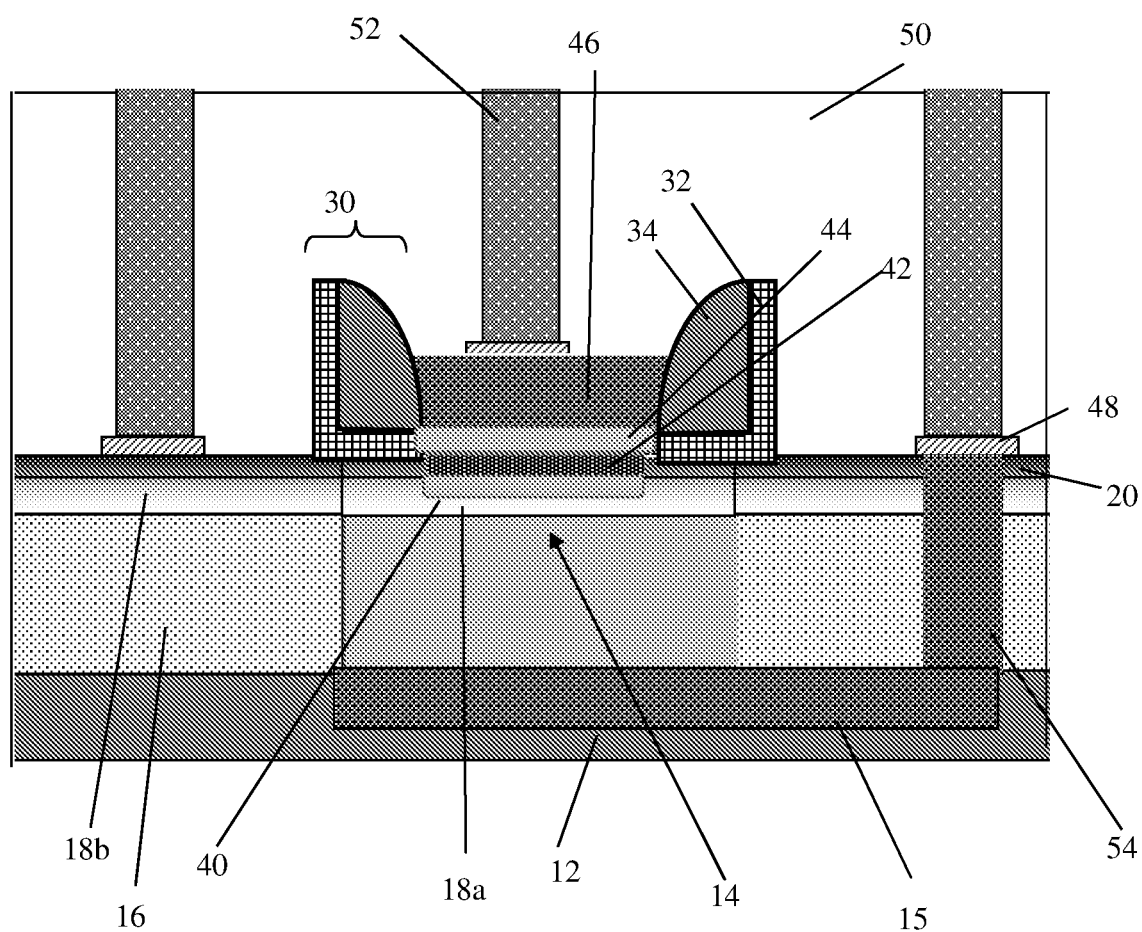

FIGS. 10A-10C show a heterojunction bipolar transistor and respective fabrication processes in accordance with additional aspects of the present disclosure. More specifically, in the structure 10b of FIG. 10A, subsequent to the formation of the spacers 30 and recess 38, the materials 40, 42, 44 and 46 will be sequentially deposited within the recess 38 and between the spacers 30, in addition to outside of the spacers 30 in a manner already described with respect to FIG. 7. This can be performed by removing the dielectric layer 22 prior to the epitaxial growth of materials 40, 42, 44 and 46.

After the deposition process, as shown in FIG. 10B, the materials 40, 42, 44 and 46 will be sequentially removed from outside of the spacers 30 using selective etching processes. More specifically, while a mask 55 is protecting the materials (e.g., covering the materials 40, 42, 44 and 46 within the spacers 30), the exposed materials can be removed by a selective etching process. The remaining processes, e.g., lithography, etching and deposition, to form the contacts, etc., are similar to that already described such that no further explanation is required for a complete understanding of the invention, as shown representatively in FIG. 10C.

The heterojunction bipolar transistor devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
  a sub-collector region in a substrate;
  a collector region above the sub-collector region, the collector region composed of a semiconductor material;
  an intrinsic base region composed of intrinsic base material surrounded by the semiconductor material above the collector region; and
  an emitter region above the intrinsic base region,
  wherein the semiconductor material includes a P+ doped material above single crystalline semiconductor material of the collector region, the intrinsic base material is surrounded by the P+ doped material, which provides a doped edge profile to the intrinsic base material, and the P+ doped material is SiGe material.

2. The structure of claim 1, wherein the semiconductor material is single crystalline Si material and the intrinsic base region extends into the single crystalline Si material of the collector region such that the intrinsic base material is surrounded by the single crystalline Si material.

3. The structure of claim 2, wherein the intrinsic base material extends through the P+ doped material and partially into the single crystalline Si material, and the P+ doped material provides an edge profile to the intrinsic base material.

4. The structure of claim 2, further comprising spacers around at least the emitter region.

5. The structure of claim 4, wherein the intrinsic base material is a discontinuous SiGe material below the spacers.

6. The structure of claim 4, further comprising an extrinsic base located along an outer edge of the spacers and which is thinner than the height of the spacers.

7. The structure of claim 6, wherein the extrinsic base region contacts the intrinsic base material.

8. The structure of claim 7, wherein the extrinsic base is ion implanted semiconductor material or a doped semiconductor material formed over or from an epitaxial poly silicon material.

9. A structure comprising:
  a sub-collector region;

a single crystalline material above the sub-collector region;

a doped material which is above or partially penetrates into the single crystalline material;

a lateral intrinsic base surrounded by the single crystalline material, above a collector region;

spacers formed on the doped material and which define an emitter region;

an extrinsic base composed of the doped material along outer edges of the spacers and which connects to the lateral intrinsic base; and emitter material above the extrinsic base and between the spacers, wherein the extrinsic base is composed of discontinuous SiGe material.

10. The structure of claim 9, further comprising additional single crystalline material and the SiGe material above the single crystalline material of the collector region and wherein the lateral intrinsic base is composed of epitaxial semiconductor material embedded within the single crystalline material.

11. The structure of claim 9, wherein the doped material is an epitaxial material above the single crystalline material.

12. The structure of claim 9, wherein the extrinsic base is thinner than the height of spacers.

13. The structure of claim 9, wherein emitter material touches the spacers within a space between the spacers.

14. The structure of claim 9, wherein the lateral intrinsic base is a discontinuous lateral intrinsic base which has a dopant profile at an edge thereof.

15. A method comprising:

forming a sub-collector region in a substrate;

forming a collector region above the sub-collector region;

forming a recess in the collector region;

forming an intrinsic base region in the recess formed in the collector region; and forming an emitter region above the intrinsic base region, wherein the collector region comprises a P+ doped semiconductor material above single crystalline semiconductor material of the collector region, the intrinsic base material is surrounded by the P+ doped material, which provides a doped edge profile to the intrinsic base material and the P+ doped material is SiGe material.

* * * * *